(12) United States Patent
Samuels

(10) Patent No.: US 6,628,927 B1
(45) Date of Patent: Sep. 30, 2003

(54) METHOD AND APPARATUS FOR TRANSMITTING AND RECEIVING SIGNALS

(75) Inventor: John Samuels, Surrey (GB)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 08/994,228

(22) Filed: Dec. 19, 1997

(30) Foreign Application Priority Data

Dec. 23, 1996 (GB) .............................................. 9626732

(51) Int. Cl.⁷ ............................................... H04B 1/40
(52) U.S. Cl. ............................. 455/77; 455/76; 455/118
(58) Field of Search ............................. 455/76, 77, 78, 455/189.1, 323, 315, 118, 553, 265; 375/219, 295; 370/281

(56) References Cited

U.S. PATENT DOCUMENTS

| | | | |
|---|---|---|---|
| 4,175,254 A | | 11/1979 | Manfreda .................... 325/433 |
| 5,160,900 A | | 11/1992 | Visuri ......................... 331/18 |
| 5,212,817 A | * | 5/1993 | Atkinson ................ 455/265 X |
| 5,276,913 A | * | 1/1994 | Lee et al. ...................... 455/76 |
| 5,291,474 A | | 3/1994 | Ikonen et al. .................. 370/30 |
| 5,301,367 A | | 4/1994 | Heinonen ..................... 455/76 |
| 5,390,168 A | | 2/1995 | Vimpari ....................... 370/30 |
| 5,465,409 A | * | 11/1995 | Borras et al. ................ 455/260 |
| 5,471,652 A | | 11/1995 | Hulkko ........................ 455/76 |
| 5,519,885 A | | 5/1996 | Vaisanen ..................... 455/76 |
| 5,535,432 A | * | 7/1996 | Dent ............................ 455/77 |
| 5,564,076 A | * | 10/1996 | Auvray ........................ 455/76 |
| 5,603,097 A | * | 2/1997 | Kanou ......................... 455/76 |
| 5,640,697 A | * | 6/1997 | Orndorff ..................... 455/315 |
| 5,752,175 A | * | 5/1998 | Roullet et al. ............ 455/183.1 |
| 5,758,266 A | * | 5/1998 | Kornfeld et al. .............. 455/86 |
| 5,862,181 A | * | 1/1999 | Ishizuka ..................... 375/259 |
| 5,974,305 A | * | 10/1999 | Matero .................... 455/188.1 |
| 6,014,561 A | * | 1/2000 | Molne ........................ 455/419 |
| 6,014,571 A | * | 1/2000 | Enoki .......................... 455/550 |
| 6,091,780 A | * | 7/2000 | Sointula ................. 375/295 X |

FOREIGN PATENT DOCUMENTS

| | | |
|---|---|---|
| EP | 0 678 974 A1 | 10/1995 |
| EP | 0717501 A1 | 6/1996 |
| GB | 2 310 342 | 8/1997 |
| WO | WO 96/08883 | 3/1996 |
| WO | WO 98/31094 | 7/1998 |

OTHER PUBLICATIONS

European Search Report dated Jun. 12, 2001, 3 pages.

* cited by examiner

*Primary Examiner*—Nay Maung
*Assistant Examiner*—Philip J. Sobutka
(74) *Attorney, Agent, or Firm*—Perman & Green, LLP

(57) ABSTRACT

A method and apparatus for receiving a radio frequency signal and a method and apparatus for transmitting a modulation signal in a multiple channel radio system. The method for receiving the radio frequency signal involves mixing the radio frequency signal with a demodulating signal, tunable in frequency steps greater than the channel spacing of the multiple channel radio system to facilitate rapid frequency adjustments. The resultant intermediate signal is then mixed with another demodulating signal, tunable in relatively smaller frequency steps in order to select the channel containing the radio frequency signal.

11 Claims, 13 Drawing Sheets

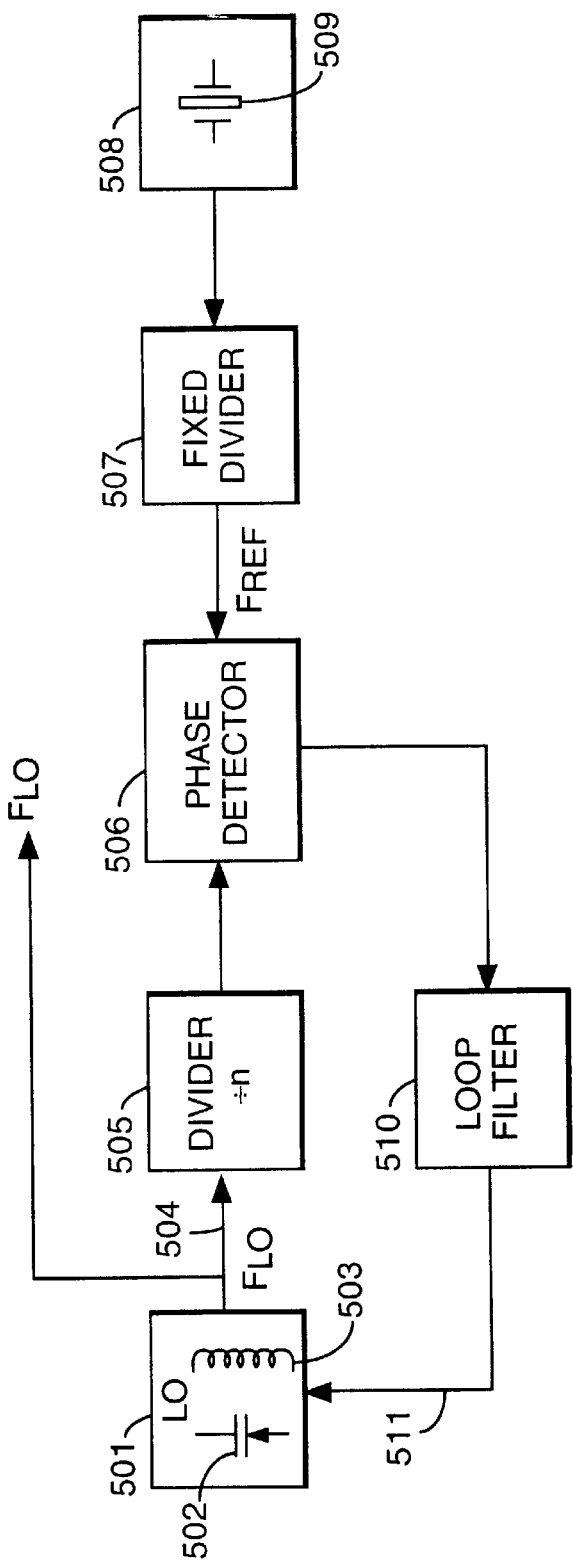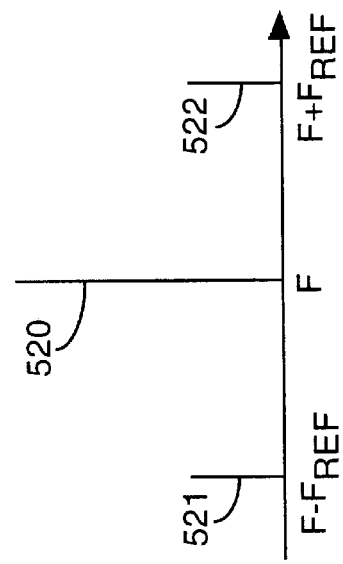

Fig.11.

| CHANNEL | IRIDIUM INPUT (MHz) | SHF (MHz) | VHF (MHz) | IRIDIUM IF1 (MHz) | IRIDIUM IF2 (MHz) |
|---|---|---|---|---|---|
| 8 | 1616.333 | 1545.0 | 233.333 | 71.333 | 13.000 |
| 9 | 1616.375 | 1545.0 | 233.500 | 71.375 | 13.000 |
| 10 | 1616.417 | 1545.0 | 233.667 | 71.417 | 13.000 |
| 11 | 1616.458 | 1546.0 | 233.833 | 71.458 | 13.000 |
| 12 | 1616.500 | 1546.0 | 230.000 | 70.500 | 13.000 |
| 13 | 1616.542 | 1546.0 | 230.167 | 70.542 | 13.000 |
| 14 | 1616.583 | 1546.0 | 230.333 | 70.583 | 13.000 |
| 15 | 1616.625 | 1546.0 | 230.500 | 70.625 | 13.000 |
| 16 | 1616.667 | 1546.0 | 230.667 | 70.667 | 13.000 |
| 17 | 1616.708 | 1546.0 | 230.833 | 70.708 | 13.000 |
| 18 | 1616.750 | 1546.0 | 231.000 | 70.750 | 13.000 |
| 19 | 1616.792 | 1546.0 | 231.167 | 70.792 | 13.000 |
| 20 | 1616.833 | 1546.0 | 231.333 | 70.833 | 13.000 |
| 21 | 1616.875 | 1546.0 | 231.500 | 70.875 | 13.000 |
| 22 | 1616.917 | 1546.0 | 231.667 | 70.917 | 13.000 |
| 23 | 1616.958 | 1546.0 | 231.833 | 70.958 | 13.000 |

Fig.12.

| CHANNEL | VHF (MHz) | IRIDIUM IF1 (MHz) | SHF (MHz) | IRIDIUM OUTPUT (MHz) |
|---|---|---|---|---|
| 8 | 232.667 | 116.333 | 1500.0 | 1616.333 |
| 9 | 232.750 | 116.375 | 1500.0 | 1616.375 |
| 10 | 232.833 | 116.417 | 1500.0 | 1616.417 |
| 11 | 232.917 | 116.458 | 1500.0 | 1616.458 |
| 12 | 231.000 | 115.500 | 1501.0 | 1616.500 |
| 13 | 231.083 | 115.542 | 1501.0 | 1616.542 |
| 14 | 231.167 | 115.583 | 1501.0 | 1616.583 |
| 15 | 231.250 | 115.625 | 1501.0 | 1616.625 |
| 16 | 231.333 | 115.667 | 1501.0 | 1616.667 |
| 17 | 231.417 | 115.708 | 1501.0 | 1616.708 |
| 18 | 231.500 | 115.750 | 1501.0 | 1616.750 |
| 19 | 231.583 | 115.792 | 1501.0 | 1616.792 |
| 20 | 231.667 | 115.833 | 1501.0 | 1616.833 |
| 21 | 231.750 | 115.875 | 1501.0 | 1616.875 |
| 22 | 231.833 | 115.917 | 1501.0 | 1616.917 |
| 23 | 231.917 | 115.958 | 1501.0 | 1616.958 |

Fig.13.

| CHANNEL | ICO INPUT (MHz) | UHF (MHz) | VHF (MHz) | ICO IF1 (MHz) | ICO IF2 (MHz) | IF2 OFFSET (kHz) | ICO IF3 (MHz) | IF3 OFFSET (KHz) | SLOT |
|---|---|---|---|---|---|---|---|---|---|
| 8 | 2170.200 | 1236.6 | 232.0 | 933.600 | 71.000 | - | 13.000 | - | - |
| 9 | 2170.225 | 1236.6 | 232.0 | 933.625 | 70.975 | -25 | 12.975 | -25 | -1 |
| 10 | 2170.250 | 1236.6 | 232.0 | 933.650 | 70.950 | -50 | 12.950 | -50 | -2 |
| 11 | 2170.275 | 1236.6 | 231.9 | 933.675 | 71.025 | +25 | 13.050 | +50 | +2 |
| 12 | 2170.300 | 1236.6 | 231.9 | 933.700 | 71.000 | - | 13.025 | +25 | +1 |
| 13 | 2170.325 | 1236.6 | 231.9 | 933.725 | 70.975 | -25 | 13.000 | - | - |
| 14 | 2170.350 | 1236.6 | 231.9 | 933.750 | 70.950 | -50 | 12.975 | -25 | -1 |
| 15 | 2170.375 | 1236.6 | 231.9 | 933.775 | 70.925 | -75 | 12.950 | -50 | -2 |
| 16 | 2170.400 | 1236.8 | 232.2 | 933.600 | 71.000 | - | 12.950 | -50 | -2 |
| 17 | 2170.425 | 1236.8 | 232.1 | 933.625 | 71.075 | +75 | 13.050 | +50 | +2 |
| 18 | 2170.450 | 1236.8 | 232.1 | 933.650 | 71.050 | +50 | 13.025 | +25 | +1 |
| 19 | 2170.475 | 1236.8 | 232.1 | 933.675 | 71.025 | +25 | 13.000 | - | - |
| 20 | 2170.500 | 1236.8 | 232.1 | 933.700 | 71.000 | - | 12.975 | -25 | -1 |
| 21 | 2170.525 | 1236.8 | 232.1 | 933.725 | 70.975 | -25 | 12.950 | -50 | -2 |
| 22 | 2170.550 | 1236.8 | 232.0 | 933.750 | 71.050 | +50 | 13.050 | +50 | +2 |
| 23 | 2170.575 | 1236.8 | 232.0 | 933.775 | 71.025 | +25 | 13.025 | +25 | +1 |

Fig.14.

| CHANNEL | SLOT | BB OFFSET (KHz) | VHF (MHz) | UHF (MHz) | ICO IF1 (MHz) | IF1 OFFSET | ICO IF2 (MHz) | ICO OUTPUT (MHz) |
|---|---|---|---|---|---|---|---|---|
| 8 | - | - | 232.0 | 1238.2 | 116.000 | - | 890.200 | 1980.200 |
| 9 | -1 | -25 | 232.0 | 1238.2 | 115.975 | -25 | 890.225 | 1980.225 |
| 10 | -2 | -50 | 232.0 | 1238.2 | 115.950 | -50 | 890.250 | 1980.250 |
| 11 | -1 | -25 | 232.1 | 1238.4 | 116.025 | +25 | 890.275 | 1980.275 |
| 12 | -2 | -50 | 232.1 | 1238.4 | 116.000 | - | 890.300 | 1980.300 |
| 13 | +1 | +25 | 231.9 | 1238.2 | 115.975 | -25 | 890.325 | 1980.325 |
| 14 | +2 | +50 | 232.0 | 1238.4 | 116.050 | +50 | 890.350 | 1980.350 |
| 15 | +1 | +25 | 232.0 | 1238.4 | 116.025 | +25 | 890.375 | 1980.375 |
| 16 | - | - | 232.0 | 1238.4 | 116.000 | - | 890.400 | 1980.400 |
| 17 | -1 | -25 | 232.0 | 1238.4 | 115.975 | -25 | 890.425 | 1980.425 |
| 18 | -2 | -50 | 232.0 | 1238.4 | 115.950 | -50 | 890.450 | 1980.450 |
| 19 | -1 | -25 | 232.1 | 1238.6 | 116.025 | +25 | 890.475 | 1980.475 |
| 20 | -2 | -50 | 232.1 | 1238.6 | 116.000 | - | 890.500 | 1980.500 |
| 21 | +1 | +25 | 231.9 | 1238.4 | 115.975 | -25 | 890.525 | 1980.525 |
| 22 | +2 | +50 | 232.0 | 1238.6 | 116.050 | +50 | 890.550 | 1980.550 |
| 23 | +1 | +25 | 232.0 | 1238.6 | 116.025 | +25 | 890.575 | 1980.575 |

METHOD AND APPARATUS FOR TRANSMITTING AND RECEIVING SIGNALS

FIELD OF THE INVENTION

The present invention relates to a method and apparatus for receiving a radio frequency signal, and a method and apparatus for transmitting a modulation signal.

DESCRIPTION OF THE PRIOR ART

Current mobile telephone systems are mainly provided by ground based (terrestrial) cellular systems such as GSM (Global System for Mobiles), PDC 800 or AMPS (Advanced Mobile Phone System). Other mobile telephone systems include the Inmarsat-M satellite system, in which subscribers use briefcasesized mobile telephones to make calls via geo-stationary orbiting satellites.

Several new proposals for mobile satellite telephone systems are currently under development by major telecommunications companies. These global systems have been well publicised and are known commercially by the trade names ICO, IRIDIUM, GLOBALSTAR and ODYSSEY. In parallel with the launch of these new mobile satellite systems, several terminal equipment manufacturers are developing handheld mobile units for use by subscribers of these systems. Some terminal equipment manufacturers are proposing developing dual-mode handsets which operate on both the ground based cellular systems and the new mobile satellite' systems.

WO 96/08883 discloses a dual mode telephone device which is operable on both satellite and land based cellular communication systems. The device includes one set of antenna and radio frequency circuits for receiving and transmitting signals in a satellite network, and another set of antenna and radio frequency circuits for receiving and transmitting in a terrestrial network. A dual mode frequency synthesiser provides for wide channel spacings when supplying the terrestrial radio frequency circuits and narrow channel spacings when supplying the satellite radio frequency circuits.

SUMMARY OF THE INVENTION

According to a first aspect of the present invention there is provided a method of receiving a radio frequency signal in a multiple channel radio system, in which each channel has an associated channel frequency and the channel frequencies of adjacent channels are separated by a channel spacing, the method comprising the steps of: processing the radio frequency signal in combination with a first analogue demodulating signal to produce a first analogue intermediate signal, and processing the first analogue intermediate signal in combination with a second analogue demodulating signal to produce a second analogue intermediate signal, wherein the frequency resolution of the first analogue demodulating signal is wider than the channel spacing, and the frequency resolution of the second analogue demodulating signal is finer than the frequency resolution of the first analogue demodulating signal, and the frequencies of the first and second analogue demodulating signals are adjusted in accordance with their respective frequency resolutions in order to tune the receiver to the radio frequency signal.

Adjustment of the first and second demodulating signals may tune the receiver to the channel frequency of the radio frequency signal. Alternatively, adjustment of the first and second demodulating signals may tune the receiver to a channel frequency in the vicinity of the radio frequency signal in order for a digital tuning process to further tune the receiver to the channel frequency of the radio frequency signal.

According to a second aspect of the present invention there is provided a method for transmitting a modulation signal in a multiple channel radio system, in which each channel has an associated channel frequency and the channel frequencies of adjacent channels are separated by a channel spacing, the method comprising the steps of: processing the modulation signal in combination with a first analogue modulating signal to produce an analogue intermediate signal, and processing the analogue intermediate signal in combination with a second analogue modulating signal to produce a radio frequency output signal at a channel frequency of the multiple channel radio system, wherein the frequency resolution of the second analogue modulating signal is wider than the channel spacing, and the frequency resolution of the first analogue modulating signal is finer than the frequency resolution of the second analogue modulating signal, and the frequencies of the first and second analogue modulating signals are adjusted in accordance with their respective frequency resolutions so as to change the channel frequency of the output signal.

The first or second analogue modulating or demodulating signal may vary across a range of frequencies in such a way that the possible frequency values which may be adopted by the signal have a minimum frequency separation. This minimum frequency separation is known as the frequency resolution of the signal and relates to the ability of the signal to resolve or differentiate between channel frequencies in the multiple channel radio system. The frequency resolution of the modulating or demodulating signal may be considered to be the minimum frequency jump that the modulating or demodulating signal may confidently perform. Accordingly, if the frequency resolution of a signal is widened then its ability to resolve is decreased i.e. the minimum jump that it may perform is larger. Conversely, if the frequency resolution of a signal is made finer then its ability to resolve is increased i.e. the minimum jump that it may perform is smaller.

A method in accordance with the first and/or second aspect of the invention provides an advantage that the aggregate settling time when changing channels in a transmitter or receiver may be decreased. By decreasing the settling time, a receiver or transmitter operating in accordance with the invention may be able to function within the specifications of newly proposed satellite telecommunications systems. Also, by decreasing the settling time, radio frequency circuits of the transmitter or receiver may be switched on slightly later. Consequently, the operating period of the radio frequency circuits may be reduced which in turn may reduce the power consumption in the transmitter or receiver.

In a preferred embodiment in accordance with the first aspect of the present invention, the first analogue intermediate signal is processed in combination with a further analogue demodulating signal before being processed in combination with the second analogue demodulating signal.

In a preferred embodiment in accordance with the second aspect of the present invention, the radio frequency output signal is processed in combination with a further modulating signal before being transmitted.

Preferably, the processing steps comprise mixing one signal in combination with another signal. The action of mixing one signal in combination with another signal is also referred to as frequency translation, frequency changing, or heterodyning.

Suitably, the modulating or demodulating signals are produced by frequency synthesisers. The frequency synthesisers may output a local oscillator signal which may be supplied to a mixing unit to enable the output to operate as a modulating or demodulating signal.

The first and second modulating or demodulating signals may be produced by separate frequency synthesisers.

One of the modulating or demodulating signals may be produced by a combined output of two frequency synthesisers.

In one preferred embodiment the frequency resolution of the second analogue demodulating signal or the first analogue modulating signal is equal to the channel spacing. Consequently, the second analogue demodulating signal or the first analogue modulating signal may select the individual channels in the multiple channel radio system.

In another preferred embodiment the frequency resolution of the second analogue demodulating signal or the first analogue modulating signal is greater than a channel spacing of the multiple channel radio system. In this case, selection of individual channels may be performed digitally in a base band environment.

According to a third aspect of the present invention there is provided radio frequency receiving apparatus for receiving a radio frequency signal of a multiple channel radio system, in which each channel has an associated channel frequency and the channel frequencies of adjacent channels are separated by a channel spacing, the apparatus comprising: signal generating means for producing a first analogue demodulating signal with a frequency resolution wider than the channel spacing, and a second analogue demodulating signal with a frequency resolution finer than the first analogue demodulating signal, first processing means for processing the radio frequency signal in combination with the first analogue demodulating signal to produce a first analogue intermediate signal, second processing means for processing the first analogue intermediate signal in combination with the second analogue demodulating signal to produce a second analogue intermediate signal, and adjusting means arranged in cooperation with the signal generating means to adjust the frequencies of the first and second demodulating signals in accordance with their respective frequency resolutions in order to tune the receiver to the radio frequency signal.

According to a fourth aspect of the present invention there is provided apparatus for transmitting a modulation signal in a multiple channel radio system, in which each channel has an associated channel frequency and the channel frequencies of adjacent channels are separated by a channel spacing, the apparatus comprising: signal generating means for producing a second analogue modulating signal with a frequency resolution wider than the channel spacing, and a first analogue modulating signal with a frequency resolution finer than the second analogue modulating signal, first processing means for processing the modulation signal in combination with the first analogue modulating signal to produce an analogue intermediate frequency signal, second processing means for processing the analogue intermediate signal in combination with the second analogue modulating signal to produce a radio frequency output signal, and adjusting means arranged in cooperation with the signal generating means to adjust the frequencies of the first and second modulating signals within their respective frequency resolutions so as to change the channel frequency of the output signal.

In one embodiment the signal generating means comprises a first synthesiser for producing the first analogue modulating or demodulating signal, and a second synthesiser for producing the second analogue modulating or demodulating signal.

Ideally, the first and/or second processing means comprises a mixing unit. Signals input to the processing means may be mixed by the mixing unit with a modulating or demodulating signal.

According to a fifth aspect of the present invention there is provided a method for receiving a radio frequency signal of a multiple channel radio system, in which each channel has an associated channel frequency and the channel frequencies of adjacent channels are separated by a channel spacing, the method comprising the steps of: processing the radio frequency signal in combination with a first analogue demodulating signal to produce a first analogue intermediate signal, and processing the first analogue intermediate signal in combination with a second analogue demodulating signal to produce a second analogue intermediate signal, wherein the frequency resolution of the second analogue demodulating signal is wider than the channel spacing, and the frequency resolution of the first analogue demodulating signal is finer than the frequency resolution of the second analogue demodulating signal, and the frequencies of the first and second analogue demodulating signals are adjusted in accordance with their respective frequency resolutions in order to tune the receiver to the radio frequency signal.

According to a sixth aspect of the present invention there is provided a method for transmitting a modulation signal in a multiple channel radio system, in which each channel has an associated channel frequency and the channel frequencies of adjacent channels are separated by a channel spacing, the method comprising the steps of: processing the modulation signal in combination with a first analogue modulating signal to produce an analogue intermediate signal, and processing the analogue intermediate signal in combination with a second analogue modulating signal to produce a analogue radio frequency output signal, wherein the frequency resolution of the first analogue modulating signal is wider than the channel spacing, and the frequency resolution of the second analogue modulating signal is finer than the frequency resolution of the first analogue modulating signal, and the frequencies of the first and second analogue modulating signals are adjusted in accordance with their respective frequency resolutions so as to change the channel frequency of the output signal.

The apparatus or the method in accordance with the invention may be suitably incorporated in a mobile, transportable or handheld radio telephone.

BRIEF DESCRIPTION OF THE DRAWINGS

Specific embodiments of the invention will now be described, by way of example only, with reference to the accompanying drawings, in which:

FIG. 5 shows a block diagram of a phase locked loop frequency synthesiser;

FIG. 11 is a table showing frequency values for the SHF and VHF synthesisers of FIG. 8 when receiving an IRIDIUM signal;

FIG. 12 is a table showing frequency values for the SHF and VHF synthesisers of FIG. 8 when transmitting an IRIDIUM signal;

FIG. 13 is a table showing frequency values for the UHF and VHF synthesisers of FIG. 9 when receiving an ICO signal; and FIG. 14 is a table showing frequency values for the UHF and VHF synthesisers of FIG. 9 when transmitting an ICO signal.

DETAILED DESCRIPTION OF THE INVENTION

Figure 1:
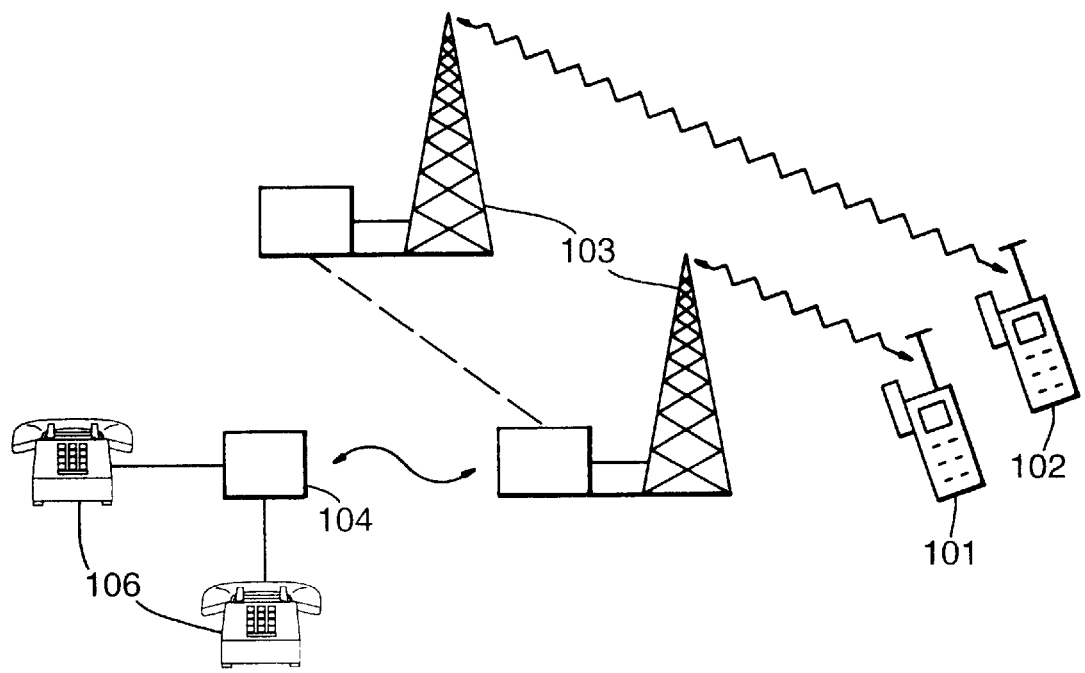
FIG. 1 shows a terrestrial mobile telecommunications system.

In the terrestrial cellular telephone system shown in FIG. 1, mobile handsets 101 and 102 communicate with the base stations 103, transferring data and digitised voice signals in a two way radio communication link. The base stations are linked together either directly or indirectly to form the cellular network, enabling telephone calls to be routed between handset 101 and handset 102. The terrestrial cellular network may also be linked to a landline telephone network 104, enabling telephone calls to be made between handsets 101 and 102 and landline telephones 106.

Figure 2:
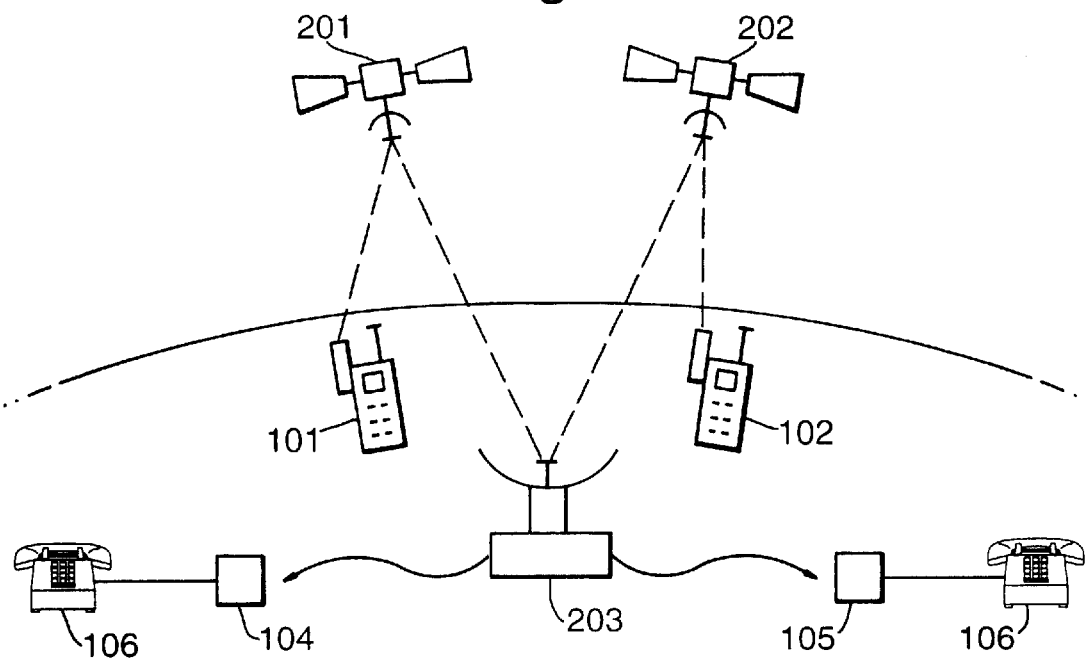
FIG. 2 shows a satellite mobile telecommunications system.

In the satellite telephone system shown in FIG. 2, mobile handsets 101 and 102 communicate with the orbiting satellites 201 and 202, transferring data and digitised voice signals in a two way radio communication link. Data from several simultaneous calls is combined in a high bandwidth communication link between the satellites 201 and 202 and an Earth-bound satellite base station 203. In this way the satellites are indirectly linked together to form the satellite network. In another satellite telephone system the satellites communicate directly with one another using a satellite-to-satellite high bandwidth communication link. Like the terrestrial cellular networks, the Earth-bound satellite base station 203 may be linked to one or more landline telephone networks 104 and 105, enabling telephone calls to be made between handsets 101 and 102 and landline telephones 106.

Figure 3:
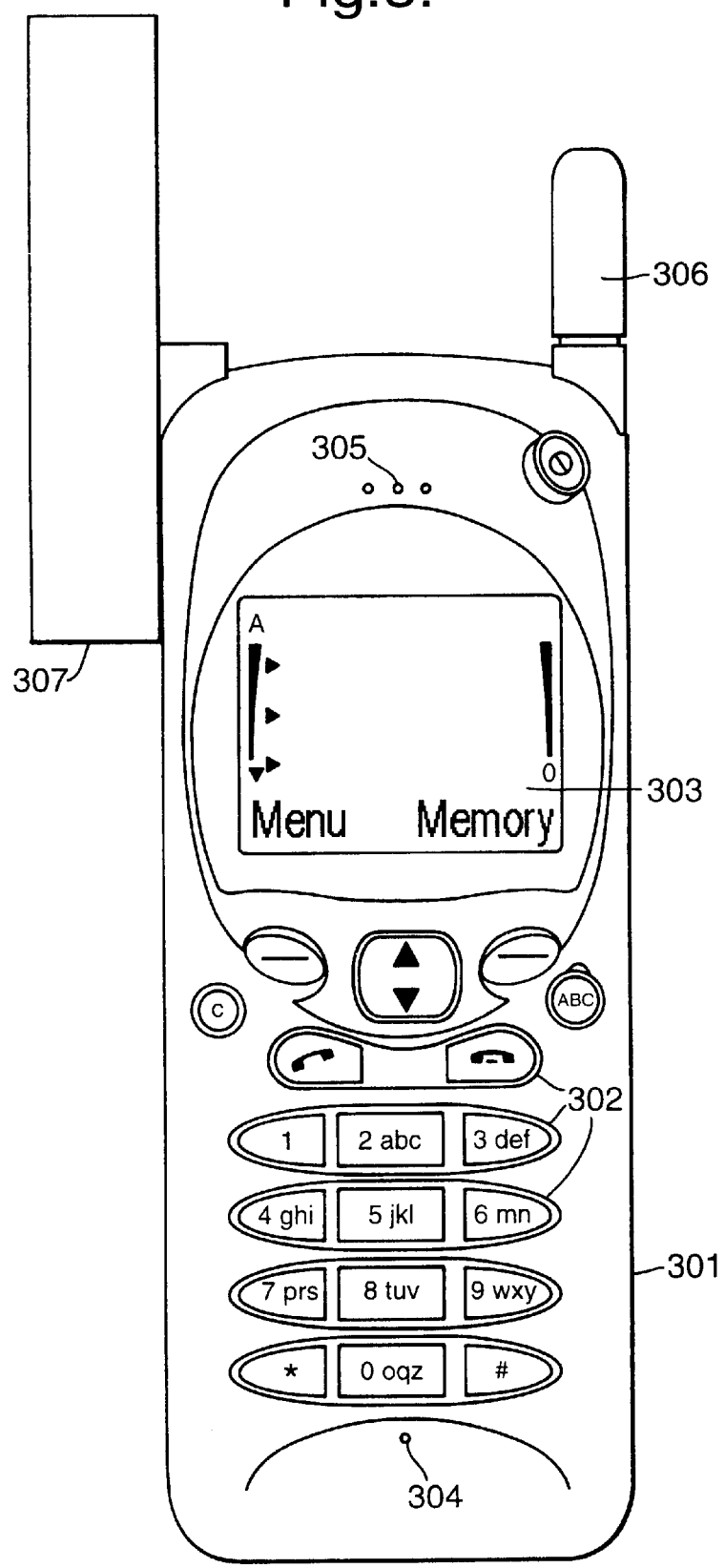
FIG. 3 shows a front view of a dual mode radio telephone.

A dual mode handset for use in a terrestrial telephone system or a satellite telephone system is shown in FIG. 3. Several buttons 302 enable various operations to be performed, including accepting a call, terminating a call, dialling a number, storing a telephone number in an alphabetical index, and so on. An alphanumeric liquid crystal display 303 provides an indication of the telephone's status, including such information as signal strength, remaining battery power, the number which has been dialled, and so on. A microphone 304 converts sound pressure waves into an electrical signals, and a loudspeaker 305 converts electrical signals into sound pressure waves. Antennas 306 and 307 radiate electromagnetic waves at transmission frequencies during transmission, and during reception convert received electromagnetic waves at reception frequencies into electrical signals. In satellite mode the satellite antenna 307 is used to transmit and receive signals at frequencies used in satellite communication. In terrestrial mode the terrestrial antenna 306 is used to transmit and receive signals at frequencies used in terrestrial communication.

Figure 4:
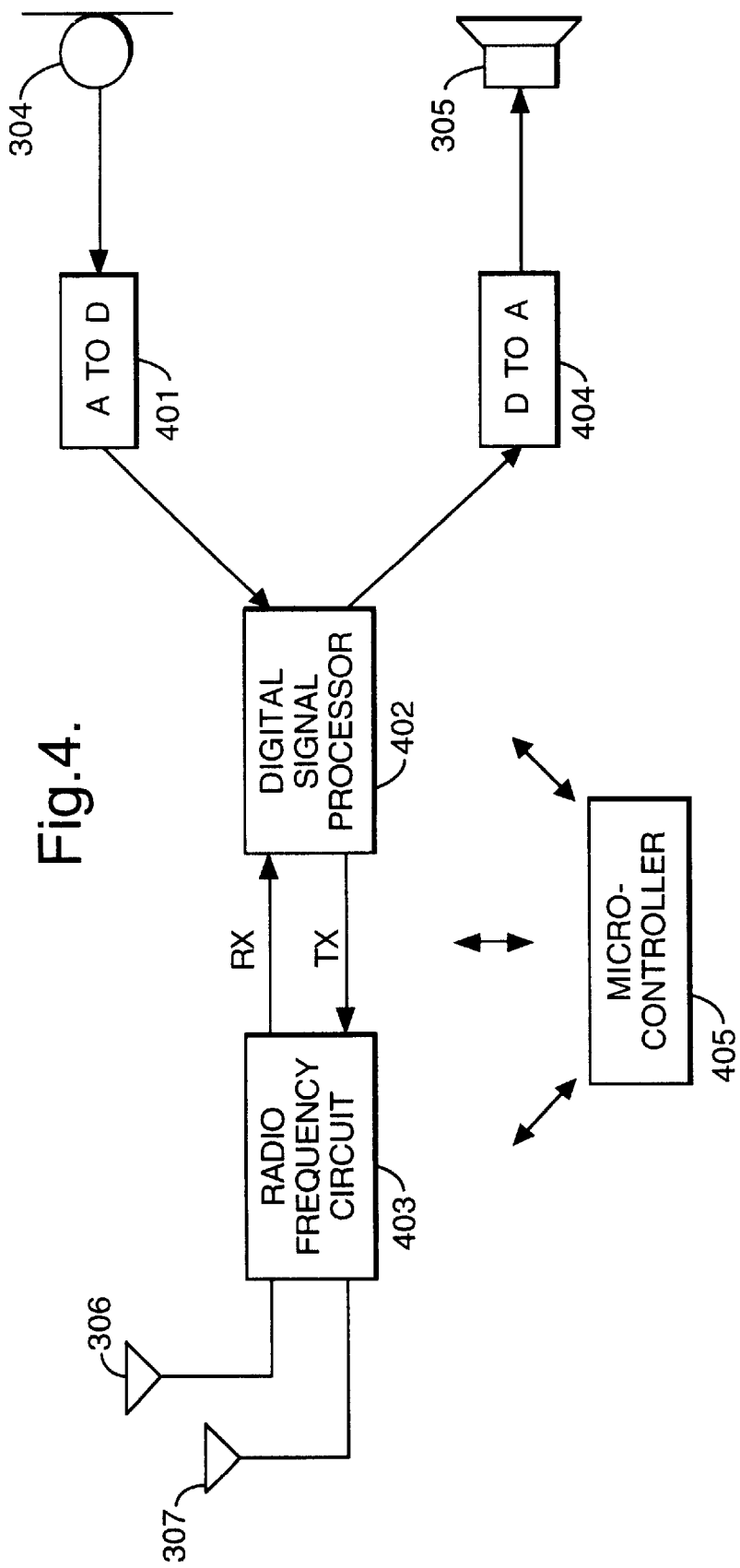
FIG. 4 shows a block diagram of the main functional components of the radio telephone shown in FIG. 3.

The main functional components of the dual mode mobile telephone 301 are shown in FIG. 4. The microphone 304 generates analogue electrical signals which are supplied to an analogue to digital converter 401. The analogue to digital converter 401 converts the analogue signals into a stream of binary numerical values representing instantaneous analogue voltages supplied by the microphone 304 at regular intervals.

Binary electrical signals representing the microphone sound pressure are supplied to a digital signal processor 402, which performs several base band processing functions on the sound signal before it is used to modulate a radio frequency signal. The digital signal processor 402 supplies a modulation signal to a radio frequency circuit 403. When transmitting, the output from the radio frequency circuit 403 is supplied to terrestrial antenna 306 or satellite antenna 307 depending on the operational mode of the telephone.

During reception, terrestrial antenna 306 or satellite antenna 307 supplies radio frequency signals to the radio frequency circuit 403. The radio frequency circuit supplies signals to the digital signal processor 402, for conversion into binary electrical samples representing sound. These binary electrical samples are supplied from the digital signal processor 402 to a digital to analogue converter 404, which converts these into an analogue voltage. The analogue voltage is supplied to the loudspeaker 305, for converting the analogue signal into sound.

A microcontroller 405 is connected to the liquid crystal display 303 and the buttons 302 shown in FIG. 3. It is also connected to the digital signal processor 402, the radio frequency circuit 403, and other parts of the telephone circuit. Instructions executed by the microcontroller 405 co-ordinate circuit operations in response to user activation of the buttons 302, and signals provided by the circuit, such as battery strength and signalling information extracted by the digital signal processor 402.

In some systems the signal supplied by the digital signal processor 402 to the radio frequency circuit 403 may be purely a modulation signal, in other words it has a zero centre frequency and does not affect the centre frequency of the channel on which the modulation signal is to be transmitted. Similarly, the signal supplied by the radio frequency circuit 403 to the digital signal processor 402 may be independent of the channel on which it has been received. In such a system, a radio frequency synthesiser in the radio frequency circuit is responsible for controlling the selection of channel frequencies.

Referring now to FIG. 5A there is shown a radio frequency phase locked loop synthesiser. A radio frequency oscillator 501 contains a tuned circuit, having a resonant frequency defined by a varicap diode 502 and an inductor 503. The oscillator 501 is typically of the type known as a Hartley or Colpitts oscillator and a signal 504 is generated having a frequency $F_{LO}$ defined by the resonant frequency of the tuned circuit.

The oscillator output 504 is supplied to a divider 505, which divides the oscillator frequency, $F_{LO}$, by an integer value, n. The divided frequency is supplied to a first input of a phase detector 506.

A reference oscillator 508 consists of a temperature-compensated crystal oscillator, having a quartz crystal 509. This oscillates at a fixed known frequency, which is divided by a fixed factor in the fixed divider 507. The output from the fixed divider 507 is known as the reference frequency, $F_{REF}$, and is supplied to a second input of the phase detector 506.

The phase detector generates an output voltage dependent on the difference in phase between its two inputs. This is supplied to a low pass loop filter 510, the output voltage 511 of which being dependent on the difference in phase between the two signals supplied to the phase detector 506. The output 511 from the loop filter 510 supplies a control voltage to the varicap diode 502 in the oscillator 501. The loop filter 510 generates a signal which pulls the phase and frequency $F_{LO}$ of the oscillator 501 to a value, which after division by n in the variable divider 505, is equal to the phase and frequency of $F_{REF}$, from the fixed divider 507.

Thus a classic phase-locked loop is formed, with the frequency $F_{LO}$ of the oscillator 501 being controlled by the integer, n, used in divider 505, and the channel spacing between increments of n being defined by the value of $F_{REF}$.

Unfortunately the programmable divider 505 cannot operate at input frequencies of greater than a few tens of megahertz, without raising cost and power consumption to unacceptable levels. A possible solution is to pre-divide the signal 504 by some fixed value using a fixed high speed divider. This technique is known as prescaling. This creates an additional problem in that $F_{REF}$ must be divided by the same amount, since the channel spacing is now equal to $F_{REF}$ multiplied by the prescaling factor.

The problem with the arrangement in FIG. 5A is further explained in FIG. 5B. Without extreme filtering, due to radio frequency feed-through, sidebands 521 and 522 are imposed on the output 504 from oscillator 501, which has a centre frequency 520. These sidebands will degrade or distort reception of the desired channel by adding unwanted modulation components. Furthermore, selectivity of adjacent reception channels will be reduced. A lower cut-off frequency could be used for the loop filter 510, in order to reduce the amplitudes of the sidebands 521 and 522, but this would result in an increase in the loop settling time. Thus narrow channel spacing and fast settling time are contradictory requirements.

Mobile radio transmission is subject to variations in signal strength due to reflections from obstacles such as buildings, trees and cars. The same radio signal may be received from several reflecting surfaces, resulting in constructive and destructive interference. The consequent changes in signal amplitude are known as Rayleigh fading. At any given moment in time, it is possible for some frequency channels to be rendered unusable by destructive interference.

The concept of frequency diversity is key to the solution of this and other interference problems in mobile radio systems. In the GSM, ICO and IRIDIUM specifications for digital cellular phones, frequency hopping is used, in which each reception or transmission burst may operate at a different frequency. Voice data is encoded in a redundant interleaved format, thus, if a particular frequency suffers interference, the missing data can be, at least partially, reconstructed from previous and subsequent bursts without communication being interrupted.

The implementation of frequency hopping imposes certain requirements on the frequency synthesiser used for selecting the desired channels. The synthesiser must be capable of switching to new frequencies within time constraints set down by the particular network protocol. The time taken for the synthesiser to settle to a new frequency is known as the settle time.

The characteristics of the radio frequency phase locked loop are the determining factor for the settling time of a radio frequency synthesiser. Referring back to FIG. 5 a problem with the phase locked loop is feed-through of the $F_{REF}$ signal from the fixed divider 507, through the phase detector 506, to the signal 511 supplied to the oscillator 501. An effect of this feed-through is instability in the phase locked loop. Removal of $F_{REF}$ from the output of the phase detector 506, and hence any instability in the phase locked loop, is performed by the loop filter 510. However, as the loop filter 510 is a low pass filter its effect is to dampen changes or hops in the frequency $F_{LO}$ which occur as a result of changes in integer n. In general, the settle time of the phase locked loop is inversely proportional to the loop filter cut-off frequency, i.e. the lower the cut-off frequency of the low pass filter, the longer the settle time of the phase locked loop. Also, the settle time of the phase locked loop is, in general, proportional to the magnitude of the change in frequency $F_{LO}$, i.e. the greater the change in frequency $F_{LO}$, the longer the settle time of the phase locked loop.

In the GSM recommendations, frequency hopping is performed on reception channels spaced 200 KHz apart and with a maximum frequency hop of 25 MHz. The GSM specification also requires that a receiver is capable of performing a single frequency hop within 0.8 ms. This requires a radio frequency synthesiser to settle to its new frequency in less than 0.8 ms. The GSM standard was developed with an awareness of the practical difficulties associated with frequency hopping and the specification is sufficiently undemanding to allow known frequency synthesisers which achieve sufficiently short settle times to be used.

In the proposed standards for satellite telephone systems, such as ICO, the switch times for fast frequency hopping have to be as short as 0.5 ms. In ICO this is partly due to dynamic allocation of RX and TX slots. Such a switch time would be possible in known frequency synthesisers if the channel spacing was comparable with the 200 KHz channel spacing found in GSM. Unfortunately, a particular constraint on the ICO satellite-based telephone system currently under development is the further requirement for a narrow channel spacing of 25 KHz, in order to make viable economic exploitation of the available bandwidth. Using the phase locked loop synthesiser of FIG. 5, the value of $F_{REF}$ would have to be 25 KHz or less to enable the selection of all possible channels in the ICO satellite receive or transmit bands. Accordingly, to prevent the 25 KHz $F_{REF}$ signal destabilizing the phase locked loop, a much lower cut-off frequency would have to be used in the loop filter 510 when compared to the cut-off frequency required in the GSM system. A result of this would be long settling times, which directly conflict with proposals for the ICO satellite system. Consequently, the phase locked loop synthesiser of FIG. 5 would not be able to manage the fast frequency hops required by the proposed ICO satellite system, particularly for frequency hops tending towards the maximum jump of 30 MHz in the ICO transmit and receive bands.

Even for mobile telephone systems that do not insist on fast settling times, unnecessary lengthening of the settling times in the transceiver results in the frequency synthesisers being switched on for a longer period than is necessary. Therefore, any measures taken to reduce the settling time of the transceiver will help to save power in the transceiver as a result of the frequency synthesisers being switched off for longer. By saving power in the transceiver, talk times and standby times may advantageously be increased.

The dual mode radio telephone of FIG. 4, in particular the radio frequency circuit 403, will be described in more detail with reference to four embodiments illustrated in FIGS. 6 to 9.

The four specific embodiments of the invention described hereafter each include a front-end RF stage specifically for receiving satellite signals transmitted from an ICO or IRIDIUM network, and a front-end RF stage specifically for receiving terrestrial signals transmitted from a GSM network. For transmission, the four embodiments each include a terminal RF stage specifically for transmitting satellite signals suitable for reception by an ICO or IRIDIUM network, and a terminal RF stage specifically for transmitting terrestrial signals suitable for reception by a GSM network. In addition, the four embodiments each include two common RF stages, one for reception and one transmission, which are used by the transceiver in both satellite mode and terrestrial mode. In other words, the common RF stage for reception is shared by the satellite and terrestrial receive paths, and the common RF stage for transmission is shared by the satellite and terrestrial transmit paths.

Figure 6:
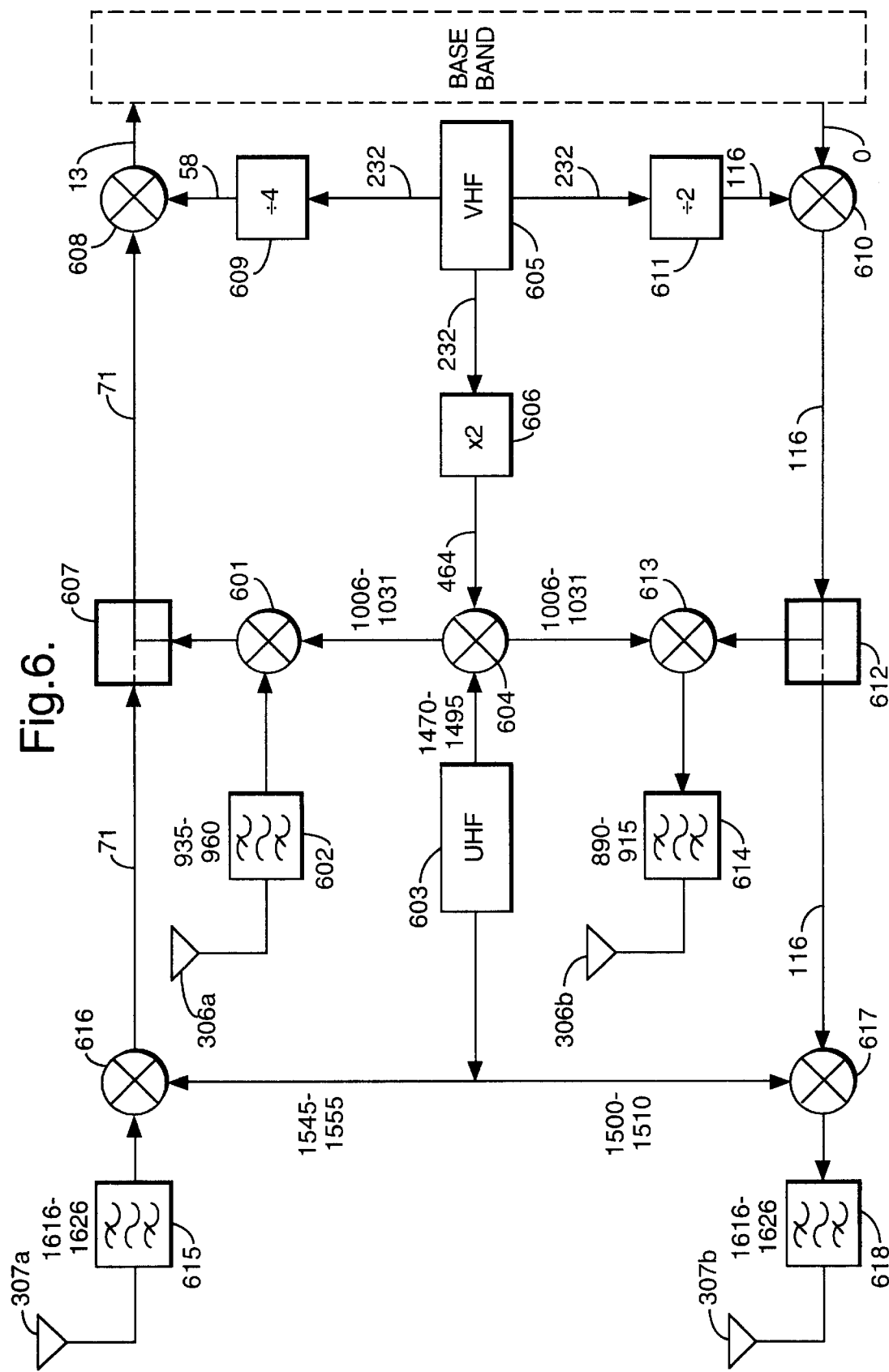
FIG. 6 shows a block diagram of a radio frequency transceiver according to a first embodiment of the invention.

FIG. 6 illustrates a first embodiment of the invention designed for use in the terrestrial GSM system and the satellite IRIDIUM system. Referring to receive operation of the radio frequency circuit in GSM mode, a terrestrial antenna 306a of the GSM front-end RF stage receives a signal within the GSM reception band of 935 to 960 MHz and supplies the received signal to a mixer 601 via a GSM bandpass filter 602. By mixing the received signal with a local oscillator signal having a frequency in the frequency range 1006 to 1031 MHz, a desired channel in the received signal is converted to a first intermediate frequency of 71 MHz. The selection of frequencies for the local oscillator signal is controlled by the output of a UHF synthesiser 603 which, under the control of the microcontroller 405 (see FIG. 4), provides an output signal in the frequency range 1470 to 1495 MHz in 200 KHz steps. The output signal of the UHF synthesiser is converted down to the frequency range 1006 to 1031 MHz by a mixer 604 in combination with a 464 MHz local oscillator signal. The 464 MHz signal is provided by a multiplier 606 coupled to a VHF signal generator 605 operating at 232 MHz. The resultant first intermediate frequency signal passes through a mode switch 607 which in GSM mode is switched to the GSM front-end RF stage as shown in FIG. 6. A second mixer 608, supplied with a local oscillator signal of 58 MHz, converts the first intermediate frequency signal down to a second intermediate frequency of 13 MHz. The 58 MHz signal is provided by a divider 609 fed with a 232 MHz signal from a VHF signal generator 605. The resultant second intermediate frequency signal is then fed into the base band section of the radio telephone for subsequent decoding.

Referring to the transmit operation of the radio frequency circuit in GSM mode, a pure modulation signal, intended for transmission in the GSM transmission band, is supplied from the base band section to a mixer 610. The modulation signal is mixed with a 116 MHz signal provided by a divider 611 coupled to the VHF signal generator 605 operating at 232 MHz. The resultant intermediate frequency signal at 116 MHz passes through a mode switch 612, which in GSM mode is switched to the GSM terminal RF stage, and is fed into a second mixer 613. By mixing the intermediate frequency signal with a local oscillator signal having a frequency in the frequency range 1006 to 1031 MHz, the intermediate frequency signal is converted to a transmit channel frequency of the GSM transmission band. The selection of frequencies for the local oscillator signal is controlled by the output of the UHF synthesiser 603 which, under the control of the microcontroller 405, provides an output signal in the frequency range 1470 to 1495 MHz in 200 KHz steps. The output signal of the UHF synthesiser 603 is converted down to the frequency range 1006 to 1031 MHz by the mixer 604 in combination with the 464 MHz local oscillator signal. Selection of a particular transmit channel in the GSM transmission band of 890 to 915 MHz is achieved by the microcontroller 405 selecting an appropriate frequency for the output signal of the UHF synthesiser 603. The transmit signal output from the mixer 613 is supplied to the terrestrial antenna 306b via the GSM bandpass filter 614.

Referring to the receive operation of the radio frequency circuit in IRIDIUM satellite mode, a satellite antenna 307a of the IRIDIUM front-end RF stage receives a signal within the IRIDIUM reception band of 1616 to 1626 MHz and supplies the received signal to a mixer 616 via an IRIDIUM bandpass filter 615. By mixing the received signal with a local oscillator signal having a frequency in the frequency range 1545 to 1555 MHz, a desired channel in the received signal is converted to a first intermediate frequency of 71 MHz. The selection of frequencies for the local oscillator signal is controlled by the output of a UHF synthesiser 603 which, under the control of the microcontroller 405, provides an output signal in the frequency range 1545 to 1555 MHz in 41.67 KHz steps. The resultant first intermediate frequency signal passes through the mode switch 607 which in IRIDIUM mode is switched to the IRIDIUM front-end RF stage as indicated by the dashed line in FIG. 6. The mixer 608, supplied with the local oscillator signal of 58 MHz, converts the first intermediate frequency signal down to a second intermediate frequency of 13 MHz. The resultant second intermediate frequency signal is then fed into the base band section of the radio telephone for subsequent decoding.

Referring to the transmit operation of the radio frequency circuit in IRIDIUM mode, a pure modulation signal, intended for transmission in the IRIDIUM transmission band, is supplied from the base band section to a mixer 610. The modulation signal is mixed with the 116 MHz signal. The resultant intermediate frequency signal at 116 MHz passes through the mode switch 612, which in IRIDIUM mode is switched to the IRIDIUM terminal RF stage, and is fed into a second mixer 617. By mixing the intermediate frequency signal with a local oscillator signal having a frequency in the range 1500 to 1510 MHz, the intermediate frequency signal is converted to a transmit channel frequency of the IRIDIUM transmission band. The selection of frequencies for the local oscillator signal is controlled by the output of the UHF synthesiser 603 which, under the control of the microcontroller 405, provides an output signal in the frequency range 1500 to 1510 MHz in 41.67 KHz steps. Selection of a particular transmit channel in the IRIDIUM transmission band of 1616 to 1626 MHz is therefore achieved by the microcontroller 405 selecting an appropriate frequency for the output signal of the UHF synthesiser 603. The transmit signal output from the mixer 617 is supplied to the satellite antenna 307b via the IRIDIUM bandpass filter 618.

Thus for the first embodiment shown in FIG. 6 the front-end RF stage for receiving GSM terrestrial signals comprises the terrestrial antenna 306a, the GSM bandpass filter 602, and the mixer 601. Likewise, the front-end RF stage for receiving IRIDIUM satellite signals comprises the satellite antenna 307a, the IRIDIUM bandpass filter 615, and the mixer 616. The common RF stage for reception comprises the switch 607, for selectively receiving either the output of the mixer 601 or the mixer 616, and the mixer 608. The common RF stage for transmission comprises the mixer 610, and the switch 612, for providing the intermediate frequency signal to either the terrestrial or the satellite terminal RF stage. The terminal RF stage for transmitting GSM terrestrial signals comprises the mixer 613, the GSM bandpass filter 614, and the terrestrial antenna 306b. The terminal RF stage for transmitting IRIDIUM satellite signals comprises the mixer 617, the IRIDIUM bandpass filter 618, and the satellite antenna 307b.

Figure 7:
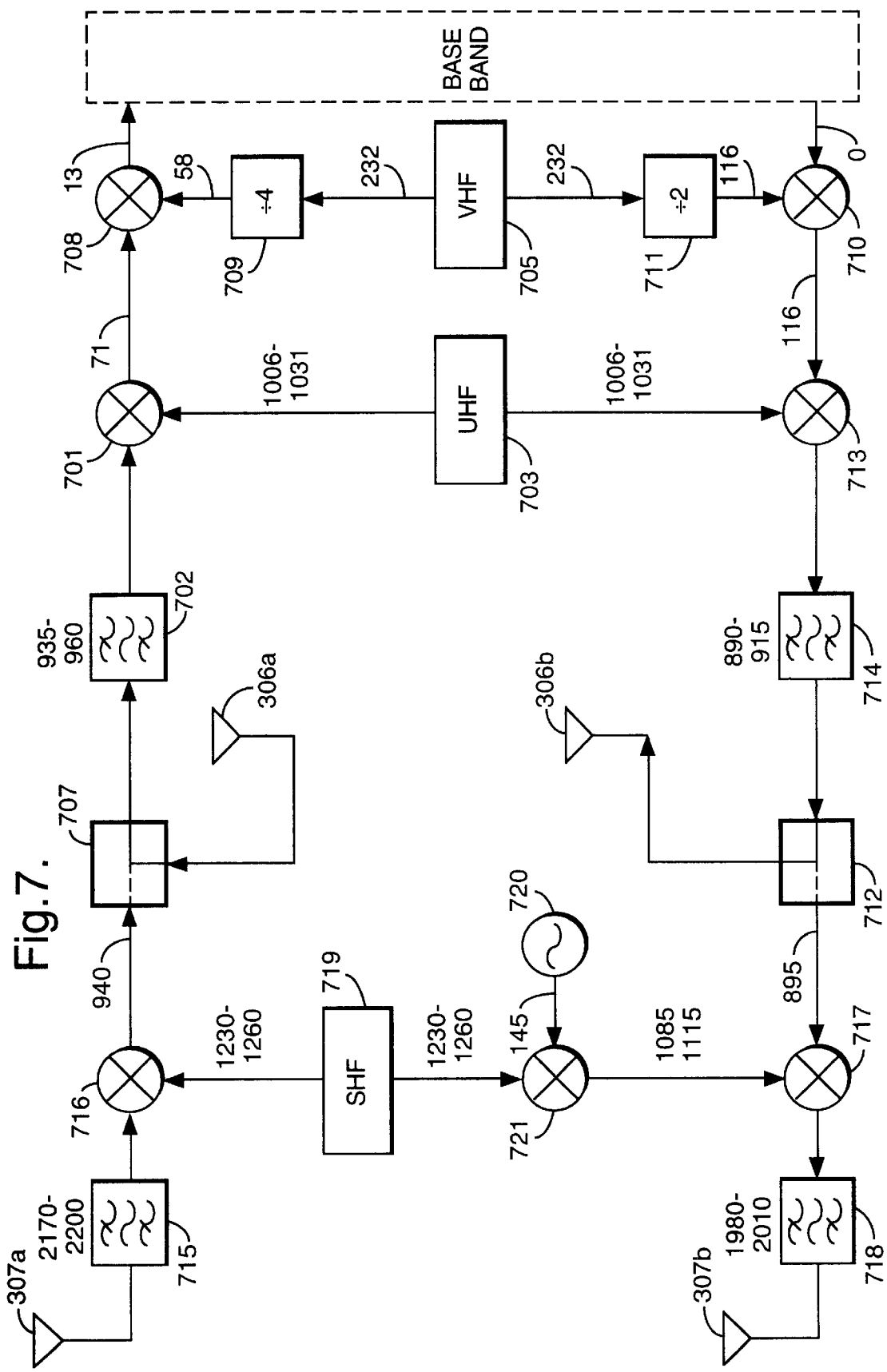
FIG. 7 shows a block diagram of a radio frequency transceiver according to a second embodiment of the invention.

FIG. 7 illustrates a second embodiment of the invention designed for use in the terrestrial GSM system and the satellite ICO system. Referring to receive operation of the radio frequency circuit in GSM mode, a terrestrial antenna 306a of the GSM front-end RF stage receives a signal within the GSM reception band of 935 MHz to 960 MHz. The received signal then continues via a mode switch 707 and a GSM bandpass filter 702 onto a mixer 701. By mixing the received signal with a local oscillator signal having a frequency in the frequency range 1006 to 1031 MHz, a desired channel in the received signal is converted to a first intermediate frequency of 71 MHz. The selection of frequencies for the local oscillator signal is controlled by the output of a UHF synthesiser 703 which, under the control of the microcontroller 405, provides an output signal in the frequency range 1006 to 1031 MHz in 200 KHz steps. A second mixer 708, supplied with a local oscillator signal of 58 MHz, converts the first intermediate frequency signal down to a second intermediate frequency of 13 MHz. The 58 MHz signal is provided by a divider 709 fed with a 232 MHz signal from a VHF signal generator 705. The resultant second intermediate frequency signal is then fed into the base band section of the radio telephone for subsequent decoding.

Referring to the transmit operation of the radio frequency circuit in GSM mode, a pure modulation signal, intended for transmission in the GSM transmission band, is supplied from the base band section to a mixer 710. The modulation signal is mixed with a 116 MHz signal provided by a divider 711 coupled to the VHF signal generator 705 operating at 232 MHz. The resultant intermediate frequency signal at 116 MHz is fed into a second mixer 713. By mixing the intermediate frequency signal with a local oscillator signal having a frequency in the frequency range 1006 to 1031 MHz, the signal is converted to a transmit channel frequency of the GSM transmission band. The selection of frequencies for the local oscillator signal is controlled by the output of the UHF synthesiser 703 which, under the control of the microcontroller 405, provides an output signal in the frequency range 1006 to 1031 MHz in 200 KHz steps. Selection of a particular transmit channel in the GSM transmission band of 890 to 915 MHz is therefore achieved by the microcontroller selecting an appropriate frequency for the output signal of the UHF synthesiser. The transmit signal output from the mixer 613 continues via a GSM bandpass filter 714 and a mode switch 712 onto the terrestrial antenna 306b.

Referring to the receive operation of the radio frequency circuit in ICO satellite mode, a satellite antenna 307a of the ICO front-end RF stage receives a signal within the ICO reception band of 2170 to 2200 MHz and supplies the received signal to a mixer 716 via an ICO bandpass filter 715. By mixing the received signal with a local oscillator signal having an appropriate frequency a desired channel in the received signal is converted to a first intermediate frequency of 940 MHz. The local oscillator signal is produced by the output of a SHF synthesiser 719 which, under the control of the microcontroller 405, provides an output signal in the frequency range 1230 to 1260 MHz in 25 KHz steps. The resultant first intermediate frequency signal passes through the mode switch 707 which in ICO mode is switched to the ICO front-end RF stage as indicated by the dashed line in FIG. 7. After passing through the GSM band filter 702 the received ICO signal is fed into the mixer 701. The mixer 701, supplied with a constant local oscillator signal of 1011 MHz from the UHF synthesiser 703, converts the first intermediate frequency signal down to a second intermediate frequency of 71 MHz. A third mixer 708 supplied with a 58 MHz local oscillator signal converts the second intermediate frequency signal down to a third intermediate frequency of 13 MHz. The resultant third intermediate frequency signal is then fed into the base band section of the radio telephone for subsequent decoding.

Referring to the transmit operation of the radio frequency circuit in ICO mode, a pure modulation signal, intended for transmission in the ICO transmission band, is supplied from the base band section to a mixer 710. The modulation signal is mixed with the 116 MHz signal. The resultant intermediate frequency signal at 116 MHz is supplied to a second mixer 713 which in combination with a 1011 MHz signal from the UHF synthesiser produces a second intermediate frequency signal at 895 MHz. The second intermediate frequency signal continues via GSM bandpass filter 714 and a mode switch 712, which in ICO mode is switched to the ICO terminal RF stage, and is fed into a second mixer 717. By mixing the second intermediate frequency signal with a local oscillator signal having a frequency in the range 1085 to 1115 MHz, the intermediate frequency signal is converted to a transmit channel frequency of the ICO transmission band. The selection of frequencies for the local oscillator signal is controlled by the output of the SHF synthesiser 719 which, under the control of a microcontroller, provides an output signal in the frequency range 1230 to 1260 MHz in 25 KHz steps. Using a 145 MHz local oscillator signal from signal generator 702, mixer unit 721 converts the output of the SHF synthesiser 719 to the frequency range 1085 to 1115 MHz. The transmit signal output from the mixer 717 is supplied to the satellite antenna 307b via an ICO bandpass filter 718.

Thus for the second embodiment shown in FIG. 7 the front-end RF stage for receiving GSM terrestrial signals comprises the terrestrial antenna 306a. The front-end RF stage for receiving ICO satellite signals comprises the satellite antenna 307a, the ICO bandpass filter 715, and the mixer 716. The common RF stage for reception comprises the switch 707, for selectively receiving either the output of the terrestrial antenna 306a or the mixer 716, the GSM bandpass filter 702, and the mixers 701 and 708. The common RF stage for transmission comprises the mixers 710 and 713, the GSM bandpass filter 714, and the switch 712, for providing the intermediate frequency signal to either the terrestrial or the satellite terminal RF stage. The terminal RF stage for transmitting GSM terrestrial signals comprises the terrestrial antenna 306b. The terminal RF stage for transmitting ICO satellite signals comprises the mixer 717, the ICO bandpass filter 718, and the satellite antenna 307b.

As discussed previously with reference to FIG. 5, the standard type of phase locked loop synthesiser is not able to provide both fast frequency hopping and narrow channel spacings. This is a particular problem for the proposed ICO satellite network and may also prove a problem in other proposed satellite networks such as IRIDIUM, GLOBALSTAR and ODYSSEY. Therefore, in order to overcome the drawbacks of the standard phase locked loop the UHF frequency synthesiser 603 and the SHF frequency synthesiser 719 comprise an improved phase locked loop known as a fractional n phase locked loop. In contrast to the standard phase locked loop where the divider 505 divides the signal $F_{LO}$ by an integer n, the fractional n phase locked loop is able to divide the signal at the same divider stage by any real positive number. The fractional n phase locked loop is thus able to provide channel spacings determined by the product of the $F_{REF}$ frequency and the fractional increments of n. The channel spacings are no longer decided purely by the frequency of $F_{REF}$, and hence a improved settling time for the ICO or IRIDIUM systems may be realized by selecting an appropriate frequency for $F_{REF}$ in the UHF synthesiser 603 or in the SHF synthesiser 719. The resolution of n is then determined according to the frequency of $F_{REF}$ and the channel spacings in the IRIDIUM or ICO systems.

The power consumption of a transceiver is dependent on the operational time of the transceiver circuitry. Long settling times result in increased operational time of the transceiver circuitry and hence increased power consumption. Therefore, by decrease the settling times of the transceiver the fractional n synthesiser may provide the added benefit of decreased power consumption in the IRIDIUM or ICO transceiver.

The UHF synthesiser 603 and the SHF synthesiser 719 includes a fractional n phase locked loop in which the frequency of the $F_{REF}$ signal is 200 KHz. At this frequency the loop filter cut off is sufficiently high to enable frequency hopping to occur within the 0.5 ms required by the ICO specifications even for the largest hop of 30 MHz in the ICO receive and transmit bands. By varying the value of n with a resolution of 1/8, the UHF synthesiser 719 is able to jump in suitable frequency increments of 25 KHz required during the reception or transmission of ICO signals. By varying the value of n with a resolution of 1/24, the SHF synthesiser 603 is able to jump in suitable frequency increments of 41.67 KHz required during the reception or transmission of IRIDIUM signals The GSM, IRIDIUM and ICO transmit and receive paths, which correspond to the respective transmit and receive operations of the radio frequency circuits of FIGS. 6 and 7, may be provided with signal amplification stages and intermediate frequency bandpass filter stages for improving the transmit and receive signals. For example, the received GSM signal in FIGS. 6 and 7 may be amplified after passing through the GSM bandpass filter 602 or 702 prior to supplying the mixing unit 601 or 701. Similarly, the transmit GSM signal may be amplified after the mixing unit 613 or 713 prior to being transmitted by the terrestrial antenna 306b. Also, the received IRIDIUM and ICO signal in FIG. 6 and FIG. 7 may be amplified after passing through the IRIDIUM bandpass filter 615 or ICO bandpass filter 715 prior to supplying the mixing unit 616 or 716. Similarly the transmit IRIDIUM or ICO signal may be amplified after the mixing unit 617 or 717 prior to being transmitted by the satellite antenna 307b.

Figure 10:
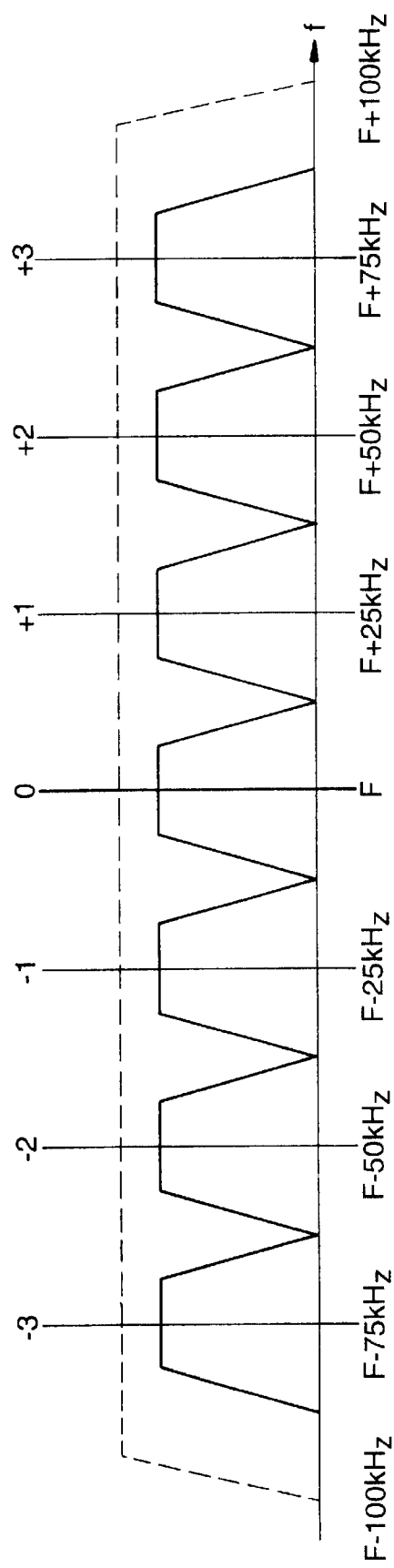
FIG. 10 shows a schematic representation of satellite channels within the bandwidth of a 200 KHz intermediate frequency filter.

Intermediate frequency bandpass filters may be provided at the 71 MHz and 13 MHz intermediate frequency stages during reception, and at the 116 MHz intermediate frequency stage during transmission to provide added selectivity and to reject interference from adjacent channels. These intermediate frequency bandpass filters may have a bandwidth of 200 KHz, equal to the channel bandwidth in the GSM system. In this way the intermediate frequency bandpass filters can provide single channel selectivity for the GSM signals, having a channel bandwidth of 200 KHz, and still permit the passage of IRIDIUM and ICO signals, having a channel bandwidth of 41.67 and 25 KHz respectively. The operation of the intermediate frequency bandpass filter in relation to the ICO satellite channels is illustrated schematically in FIG. 10. The dotted line shows the bandpass filter centered on the intermediate frequency F and having a total bandwidth of 200 KHz. The desired ICO satellite channel is shown as a solid line centred on the intermediate frequency F and having a total channel bandwidth of 25 KHz. Six other neighbouring satellite channels are shown at the positions −3, −2, −1, +1, +2, and +3. All seven of the satellite channels shown in FIG. 10 can proceed through the intermediate frequency bandpass filter. Therefore, during reception further digital filtering of the received IRIDIUM and ICO signals may be performed in base band to achieve added selectivity of the desired satellite channel not provided for by the 200 KHz intermediate frequency bandpass filters.

Figure 8:
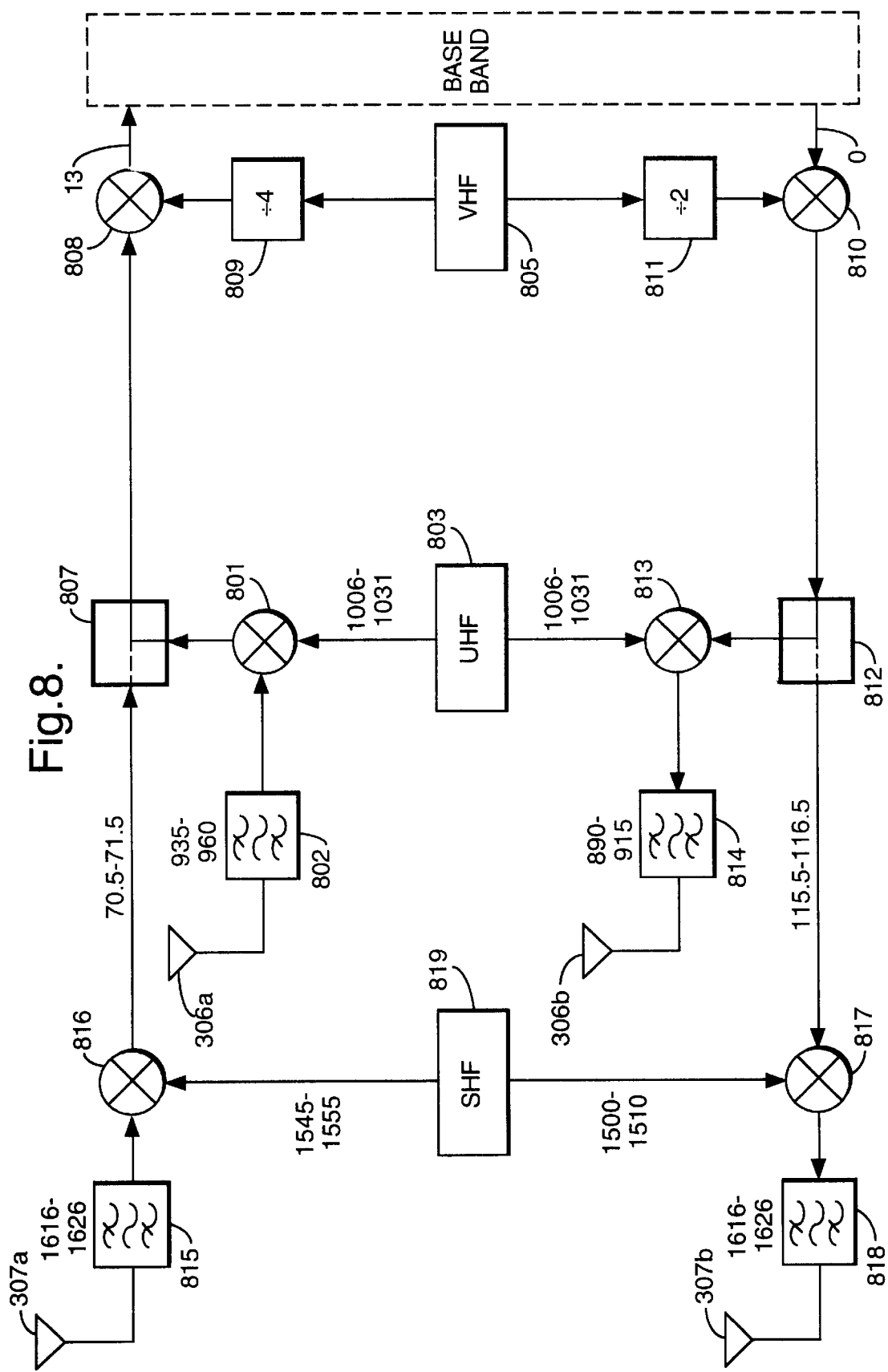
FIG. 8 shows a block diagram of a radio frequency transceiver according to a third embodiment of the invention.

FIG. 8 illustrates a third embodiment of the invention desingned for use in the terrestrial GSM system and the satellite IRIDIUM system. Referring to receive operation of the radio frequency circuit in GSM mode, a terrestrial antenna 306a of the GSM front-end RF stage receives a signal within the GSM reception band of 935 MHz to 960 MHz and supplies the received signal to a mixer 801 via a GSM bandpass filter 802. By mixing the received signal with a local oscillator signal having a frequency in the frequency range 1006 to 1031 MHz, a desired channel in the received signal is converted to a first intermediate frequency of 71 MHz. The selection of frequencies for the local oscillator signal is controlled by the output $F_{LO}$ of a UHF synthesiser 803 which, under the control of a microcontroller, provides an output signal in the frequency range 1006 to 1031 MHz in 200 KHz steps. The resultant first intermediate frequency signal passes through a mode switch 807 which in GSM mode is switched to the GSM front-end RF stage as shown in FIG. 8. A second mixer 808, supplied with a local oscillator signal of 58 MHz, converts the first intermediate frequency signal down to a second intermediate frequency of 13 MHz. The 58 MHz signal is provided by a divider 809 fed with a 232 MHz signal from a VHF synthesiser 805. The resultant second intermediate frequency signal is then fed into the base band section of the radio telephone for subsequent decoding.

Referring to the transmit operation of the radio frequency circuit in GSM mode, a pure modulation signal, intended for transmission in the GSM transmission band, is supplied from the base band section to a mixer 810. The modulation signal is mixed with a 116 MHz signal provided by a divider 811 coupled to the VHF signal generator 805 operating at 232 MHz. The resultant intermediate frequency signal at 116 MHz passes through a mode switch 812, which in GSM mode is switched to the GSM terminal RF stage, and is fed into a second mixer 813. By mixing the intermediate frequency signal with a local oscillator signal having a frequency in the frequency range 1006 to 1031 MHz, the intermediate frequency signal is converted to a transmit channel frequency of the GSM transmission band. The selection of frequencies for the local oscillator signal is controlled by the output of the UHF synthesiser 803 which, under the control of a microcontroller, provides an output signal in the frequency range 1006 to 1031 MHz in 200 KHz steps. Selection of a particular transmit channel in the GSM transmission band of 890 to 915 MHz is therefore achieved by the microcontroller selecting an appropriate frequency for the output signal of the UHF synthesiser 803. The output of the mixer 813 is supplied to the terrestrial antenna 306b via the GSM bandpass filter 814.

Referring to the receive operation of the radio frequency circuit in IRIDIUM satellite mode, a satellite antenna 307a of the IRIDIUM front-end RF stage receives a signal within the IRIDIUM reception band of 1616 to 1626 MHz and supplies the received signal to a mixer 816 via an IRIDIUM bandpass filter 815. By mixing the received signal with a local oscillator signal leaving a frequency in the frequency range 1545 to 1555 MHz, a desired channel in the intermediate frequency signal is converted to a first intermediate frequency in the range 70.5 to 71.5 MHz. The selection of frequencies for the local oscillator signal is controlled by the output $F_{LO}$ of a SHF synthesiser 819 which, under the control of a microcontroller, provides an output signal in the frequency range 1545 to 1555 MHz in 1000 KHz steps. The resultant first intermediate frequency signal passes through the mode switch 807 which in IRIDIUM mode is switched to the IRIDIUM front-end RF stage as indicated by the dashed line in FIG. 8. A second mixer 808, supplied with an appropriate local oscillator signal in the range 57.5 to 58.5 MHz, converts the first intermediate frequency signal in the range 70.5 to 71.5 MHz down to a second intermediate frequency of 13 MHz. The VHF synthesiser 805 provides a tuning local oscillator signal in the range 230.0 to 234.0 in 166.67 KHz steps which when coupled to the divider 809 provides a tuning local oscillator signal in the range 57.5 to 58.5 MHz in 41.67 KHz steps. The resultant 13 MHz second intermediate frequency signal is then fed into the base band section of the radio telephone for subsequent decoding.

Referring to the transmit operation of the radio frequency circuit in IRIDIUM mode, a pure modulation signal, intended for transmission in the IRIDIUM transmission band, is supplied from the base band section to a mixer 810. The modulation signal is mixed with a tuning local oscillator signal in the range 115.5 to 116.5 MHz in 41.67 KHz steps provided by a divider coupled to the VHF signal generator 805 operating in the range 231.0 to 233.0 in 83.33 KHz steps via a divider 811 to the mixer 810. The resultant intermediate frequency signal in the range 115.5 to 116.5 MHz passes through a mode switch 812, which in IRIDIUM mode is switched to the IRIDIUM terminal RF stage, and is fed into a second mixer 815. By mixing the intermediate frequency signal with a tuning local oscillator signal having a frequency in the range 1500 to 1510 MHz, the intermediate frequency signal is converted to a transmit channel frequency of the IRIDIUM transmission band. The selection of frequencies for the local oscillator signal is controlled by the output $F_{LO}$ of the SHF synthesiser 819 which, under the control of a microcontroller, provides an output signal in the frequency range 1500 to 1510 MHz in 1000 KHz steps. Selection of a particular transmit channel in the IRIDIUM transmission band of 1616 to 1626 MHz is therefore achieved by the microcontroller selecting an appropriate frequencies for the SHF and VHF synthesisers. The transmit signal output from the mixer 817 is supplied to the satellite antenna 307b via the IRIDIUM bandpass filter 818.

Thus for the third embodiment shown in FIG. 8 the front-end RF stages, the terminal RF stages, and the common RF stages are equivalent to those shown in FIG. 6.

The problem of achieving fast frequency hopping and fine channel resolution is solved in the third embodiment by using more than one tunable synthesiser to receive and transmit the satellite signals.

In the third embodiment the SHF synthesiser 819 provides coarse tuning across the IRIDIUM transmit and receive bands and includes a standard phase locked loop in which a 200 KHz $F_{REF}$ signal is supplied to the phase detector 506. With the $F_{REF}$ signal operating at 200 KHz, the loop filter cut-off is high, resulting in a decrease in the settling time of the synthesiser which in turn can save power in the transceiver. In contrast, the VHF synthesiser 805 provides fine tuning across a relatively narrow range to achieve the precise channel selection required during the reception or transmission of IRIDIUM signals.

FIG. 11 presents suitable values for the SHF synthesiser 819 and VHF synthesiser 805 when receiving IRIDIUM satellite signals from channels 8 to 23. Similarly, FIG. 12 presents suitable values for the SHF synthesiser 819 and VHF synthesiser 805 in FIG. 8 when transmitting IRIDIUM satellite signals from channels 8 to 23. The SHF synthesiser 819 varies across the full 10 MHz bandwidth associated with the IRIDIUM transmit and receive bands, whereas the VHF synthesiser 805 varies across a relatively narrower frequency range centred around 232 MHz. As such, the VHF synthesiser 805 tunes in finer steps of 166.67 KHz during reception and 83.33 KHz during transmission and because the maximum frequency jump of the VHF synthesiser when hopping between channels is relatively small, the VHF synthesiser does not significantly increase the settling time of the transmitter or receiver.

The GSM and IRIDIUM transmit and receive paths, which correspond to the respective transmit and receive operations-of the radio frequency circuit of FIGS. 8, may be provided with signal amplification stages and an intermediate frequency bandpass filter stage for improving the respective transmit or receive signals. For example, the received GSM signal in FIG. 8 may be amplified after passing through the GSM bandpass filters 802 prior to supplying the mixing unit 801. Similarly, the transmit GSM signal may be amplified after the mixing unit 813 prior to being transmitted by the terrestrial antenna 306b. Also, the received IRIDIUM signal in FIG. 8 may be amplified after passing through the IRIDIUM bandpass filter 815 prior to supplying the mixing unit 816. Similarly the transmit IRIDIUM signal may be amplified after the mixing unit 817 prior to being transmitted by the satellite antenna 307b.

An intermediate frequency bandpass filter may be provided at the 13 MHz intermediate frequency stage during-reception to provide added selectivity and to reject interference from adjacent channels. This intermediate frequency bandpass filter may have a bandwidth of 200 KHz, equal to the channel bandwidth in the GSM system. In this way the intermediate frequency bandpass filter can provide the single channel selectivity for the GSM signals having a channel bandwidth of 200 KHz and still permit the passage of IRIDIUM signals having a channel bandwidth of 41.67 KHz.

Figure 9:
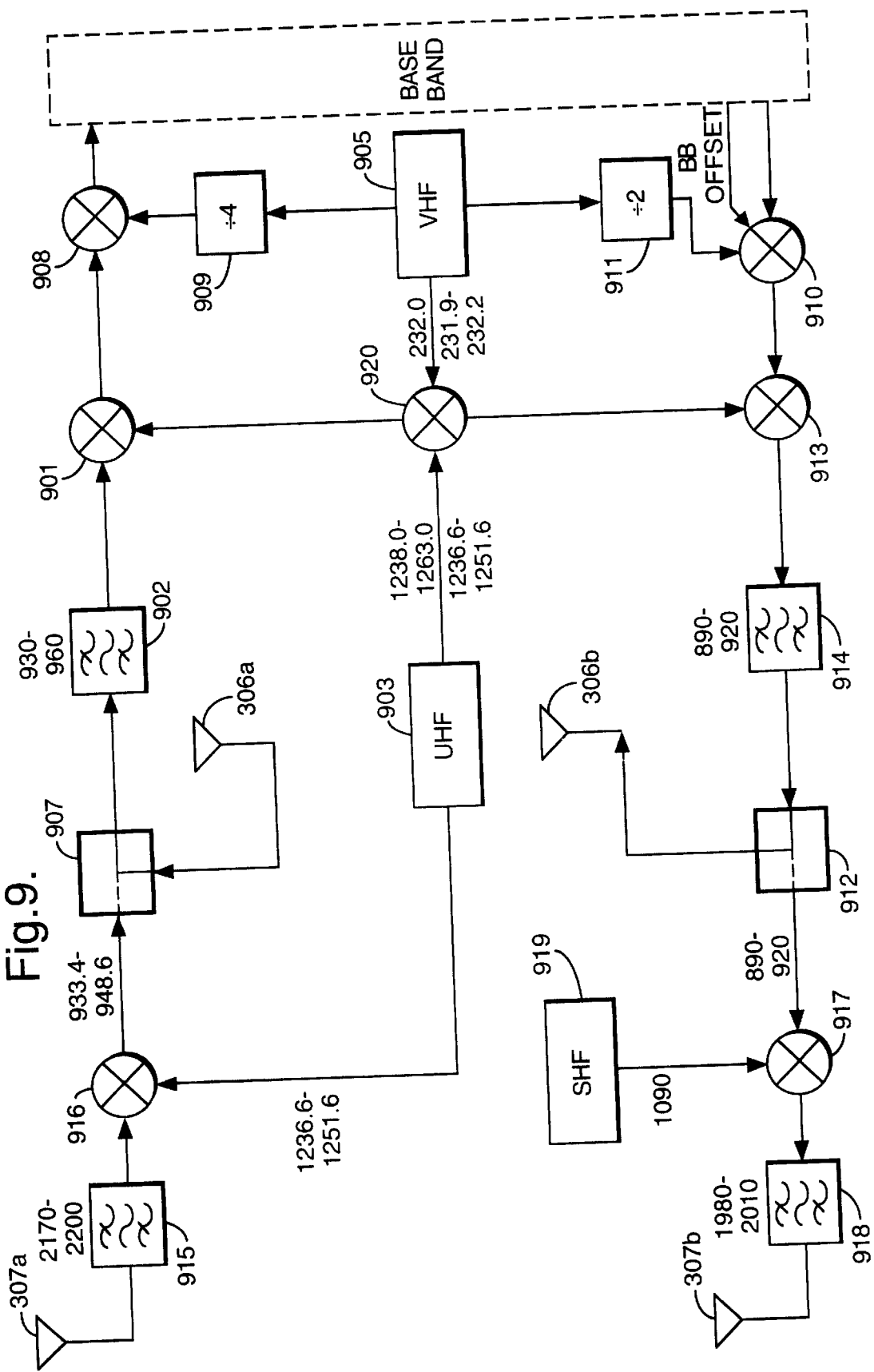
FIG. 9 shows a block diagram of a radio frequency transceiver according to a fourth embodiment of the invention.

FIG. 9 illustrates a fourth embodiment of the invention designed for use in the terrestrial GSM system and the satellite ICO system. Referring to receive operation of the radio frequency circuit in GSM mode, a terrestrial antenna 306a of the GSM front-end RF stage receives a signal within the GSM reception band of 935 MHz to 960 MHz. The received signal then continues via a mode switch 907 and a GSM bandpass filter 902 onto a mixer 901. By mixing the received signal with a local oscillator signal having a frequency in the frequency range 1006 to 1031 MHz, a desired channel in the received signal is converted to a first intermediate frequency of 71 MHz. A mixer 920, supplied with a fixed 232 MHz signal from the VHF synthesiser 905 and a variable frequency signal from the UHF synthesiser 903, provides the local oscillator signal. The selection of frequencies for the local oscillator signal is controlled by the output of a UHF synthesiser 903 which, under the control of a microcontroller, provides an output signal in the frequency range 1238.0 to 1263.0 MHz in 200 KHz steps. A second mixer 908, supplied with a local oscillator signal of 58 MHz, converts the first intermediate frequency signal down to a second intermediate frequency of 13 MHz. The 58 MHz signal is provided by a divider 909 fed with a 232 MHz signal from a VHF signal generator 905. The resultant second intermediate frequency signal is then fed into the base band section of the radio telephone for subsequent decoding.

Referring to the transmit operation of the radio frequency circuit in GSM mode, a pure modulation signal, intended for transmission in the GSM transmission band, is supplied from the base band section to a mixer 910. The modulation signal is mixed with a 116 MHz signal provided by a divider 911 coupled to the VHF signal generator 905 operating at 232 MHz. The resultant intermediate frequency signal at 116 MHz is fed into a second mixer 913. By mixing the intermediate frequency signal with a local oscillator signal having a frequency in the frequency range 1006 to 1031 MHz, the signal is converted to a transmit channel frequency of the GSM transmission band. A mixer 920, supplied with a fixed 232 MHz signal from the VHF synthesiser 905 and a variable frequency signal from the UHF synthesiser 903, provides the local oscillator signal. The selection of frequencies for the local oscillator signal is controlled by the output of the UHF synthesiser 903 which, under the control of the microcontroller 405, provides an output signal in the frequency range 1238.0 to 1263.0 MHz in 200 KHz steps. Selection of a particular transmit channel in the GSM transmission band of 890 to 915 MHz is therefore achieved by the microcontroller selecting an appropriate frequency for the output signal of the UHF synthesiser 903. The transmit signal output from the mixer 913 continues via a GSM bandpass filter 914 and a mode switch 912 onto the terrestrial antenna 306*b*.

Referring to the receive operation of the radio frequency circuit in ICO satellite mode, a satellite antenna 307*a* of the ICO front-end RF stage receives a signal within the ICO reception band of 2170 to 2200 MHz and supplies the received signal to a mixer 916 via an ICO bandpass filter 915. By mixing the received signal with a local oscillator signal having an appropriate frequency a desired channel in the received signal is converted to a first intermediate frequency in the range 933.4 to 948.6 MHz. The local oscillator signal is produced by the output $F_{LO}$ of the UHF synthesiser 903 which, under the control of a microcontroller, provides an output signal in the frequency range 1236.6 to 1251.6 MHz in 200 KHz steps. The resultant first intermediate frequency signal passes through the mode switch 907 which in ICO mode is switched to the ICO front-end RF stage as indicated by the dashed line in FIG. 9. After passing through the GSM band filter 902 the received ICO signal is fed into the mixer 901. The mixer 901, supplied with a constant local oscillator signal of 1011 MHz from the UHF synthesiser 903 and the VHF synthesiser 905, converts the first intermediate frequency signal down to a second intermediate frequency of 71 MHz. A third mixer 908 supplied with a 58 MHz local oscillator signal converts the second intermediate frequency signal down to a third intermediate frequency of 13 MHz. The resultant third intermediate frequency signal is then fed into the base band section of the radio telephone for subsequent decoding.

Referring to the transmit operation of the radio frequency circuit in ICO mode, a pure modulation signal, intended for transmission in the ICO transmission band, is supplied from the base band section to a mixer 910. The modulation signal is mixed with a 116 MHz signal provided by a divider 911 coupled to the VHF signal generator 905 operating at 232 MHz. The resultant intermediate frequency signal at 116 MHz is supplied to a second mixer 913 which in combination with a 1011 MHz signal from the UHF synthesiser produces a second intermediate frequency signal at 895 MHz. The second intermediate frequency signal continues via the GSM band pass filter 914 and a mode switch 912, which in ICO mode is switched to the ICO terminal RF stage, and is fed into a second mixer 917. By mixing the second intermediate frequency signal with a local oscillator signal having a frequency of 1090 MHz, the intermediate signal is converted to a transmit channel frequency of the ICO transmission band. The transmit signal output from the mixer 917 is supplied to the satellite antenna 307*b* via the ICO bandpass filter 918.

Thus for the fourth embodiment shown in FIG. 9 the front-end RF stages, the terminal RF stages, and the common RF stages are equivalent to those shown in FIG. 7.

The problem of achieving fast frequency hopping and fine channel resolution is solved in the fourth embodiment by using more than one tuneable synthesiser to receive and transmit the satellite signals.

In the fourth embodiment the UHF synthesiser 903 provides coarse tuning across the ICO transmit and receive bands and includes a standard phase locked loop in which a 200 KHz $F_{REF}$ signal is supplied to the phase detector 506. With the $F_{REF}$ signal operating at 200 KHz, the loop filter cut-off is sufficiently high to enable frequency hopping to occur within the 0.5 ms required by the ICO specifications even for the largest frequency hop of 30 MHz in the ICO receive and transmit bands. In contrast, the VHF synthesiser 905 provides fine tuning across a relatively narrow range to achieve finer channel selection for the reception or transmission of ICO signals. During reception, the coarse and fine tuning of the UHF and VHF synthesisers provides the desired satellite signal in one of five reception channels at the base band stage. The five reception channels are adjacent to one another and correspond to the satellite channels with the labels −2, −1, 0, +1, and +2 in FIG. 10. By incorporating additional digital tuning in base band, selectivity of the desired satellite channel from the five possible reception channels is achieved. Digital base band tuning of this kind is described in the applicant's co-pending UK application GB 9605240.2, a copy of which is enclosed herewith in annex A.

FIG. 13 presents suitable values for the UHF synthesiser 903 and VHF synthesiser 905 when receiving ICO satellite signals from channels 8 to 23. Similarly, FIG. 14 presents suitable values for the UHF synthesiser 903 and VHF synthesiser 905 in FIG. 9 when transmitting ICO satellite signals from channels 8 to 23. The UHF synthesiser 903 varies across the full 30 MHz bandwidth associated with the ICO transmit and receive bands, whereas the VHF synthesiser 905 varies across a relatively narrower frequency range centred around 232 MHz. As such, the VHF synthesiser 305 can tune in finer steps of 100 KHz during transmission and reception because the maximum frequency jump of the VHF synthesiser when hopping between channels is not large enough to significantly effect the total settling time of the transmitter or receiver. The column labelled SLOT in FIG. 13 indicates which of the satellite channels shown in FIG. 10 the desired satellite signals is located when it is fed to base band. The column labelled SLOT in FIG. 14 indicates the base band frequency offset required for mixing with the modulation signal in the mixer 910.

The GSM and ICO transmit and receive paths, which correspond to the respective transmit and receive operations of the radio frequency circuits of FIGS. 9, may be provided with signal amplification stages and intermediate frequency bandpass filter stages for improving the respective transmit or receive signals. For example, the received GSM signal in FIG. 9 may be amplified after passing through the GSM bandpass filter 902 prior to supplying the mixing unit 901. Similarly, the transmit GSM signal may be amplified after the mixing unit 913 prior to being transmitted by the terrestrial antenna 306b. Also, the received ICO signal in FIG. 9 may be amplified after passing through the ICO bandpass filter 915 prior to supplying the mixing unit 916. Similarly the transmit ICO signal may be amplified after the mixing unit 917 prior to being transmitted by the satellite antenna 307b.

Intermediate frequency bandpass filters may be provided at the 71 MHz and 13 MHz intermediate frequency stages during reception and at the 116 MHz intermediate frequency stage during transmission to provide added selectivity and to reject interference from adjacent channels. These intermediate frequency bandpass filters may have a bandwidth of 200 KHz, equal to the channel bandwidth in the GSM system. In this way the intermediate frequency bandpass filters can provide the single channel selectivity for the GSM signals having a channel bandwidth of 200 KHz and still permit the passage of ICO signals having a channel bandwidth of 25 KHz. The operation of the intermediate frequency bandpass filters is illustrated schematically in FIG. 10. The dotted line shows the bandpass filter centred on the intermediate frequency F and having a total bandwidth of 200 KHz. The intermediate frequency bandpass filter allows the progress of satellite channels having an offset from F of up to +/−75 KHz. As such, the 13, 71, and 116 MHz intermediate frequency satellite signals, presented in FIGS. 13 and 14, each have sufficiently small offsets to enable them to progress through the respective 200 KHz intermediate bandpass filters.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims. For example, the satellite systems, ICO and IRIDIUM referred to in the specific embodiments may alternatively be other types of satellite system such as ODYSSEY or GLOBALSTAR. Equally, the GSM terrestrial system referred to in the specific embodiment may be another type of terrestrial system such as DECT or DCS 1800.

The present invention includes any novel feature or combination of features disclosed herein either explicitly or any generalisation thereof irrespective of whether or not it relates to the claimed invention or mitigates any or all of the problems addressed.

I claim:

1. A method for transmitting a modulation signal in a multiple channel radio system, in which each channel has an associated channel frequency and the channel frequencies of adjacent channels are separated by a channel spacing, the method comprising the steps of:

selecting, by means of a switch, one of said multiple channels, a selected one of said channels providing a radio frequency output signal at a channel frequency of the multiple channel radio system;

a first processing step of processing the modulation signal in combination with a first analogue modulating signal to produce an analogue intermediate signal, and a second processing step of processing the analogue intermediate signal in combination with a second analogue modulating signal to produce said radio frequency output signal at said channel frequency of the multiple channel radio system, wherein said second processing step includes an offsetting of the frequency in at least one of said multiple channels at a circuit point following said switch with reference to a direction of signal flow in said selected channel, wherein the frequency resolution of the second analogue modulating signal is wider than the channel spacing, and the frequency resolution of the first analogue modulating signal is finer than the frequency resolution of the second analogue modulating signal, and the frequencies of the first and second analogue modulating signals are adjusted in accordance with their respective frequency resolutions so as to change the channel frequency of the output signal.

2. A method as claimed in claim 1, wherein the radio frequency output signal is processed in combination with a further modulating signal before being transmitted.

3. A method as claimed in claim 1, wherein the processing steps comprise mixing one signal in combination with another signal.

4. A method as claimed in claim 1, wherein the modulating signals are produced by frequency synthesizers.

5. A method as claimed in claim 1, wherein the first and second modulating signals are produced by separate frequency synthesizers.

6. A method as claimed in claim 1, wherein one of the signals is produced by a combined output of two frequency synthesizers.

7. A method as claimed in claim 1, wherein the frequency resolution of the first analogue modulating signal is equal to the channel spacing.

8. A method as claimed in claim 1, wherein the frequency resolution of the first analogue modulating signal is greater than a channel spacing.

9. Apparatus for transmitting a modulation signal in a multiple channel radio system, in which each channel has an associated channel frequency and the channel frequencies of adjacent channels are separated by a channel spacing, the apparatus comprising:

means, including a switch, for selecting one of said multiple channels, a selected one of said channels providing a radio frequency output signal at a channel frequency of the multiple channel radio system;

signal generating means for producing a second analogue modulating signal with a frequency resolution wider than the channel spacing, and a first analogue modulating signal with a frequency resolution finer than the second analogue modulating signal, first processing means for processing the modulation signal in combination with the first analogue modulating signal to produce an analogue intermediate frequency signal, second processing means for processing the analogue intermediate signal in combination with the second analogue modulating signal to produce said radio frequency output signal in said one channel, wherein said second processing means provides an offsetting of the frequency in at least one of said multiple channels at a circuit point following said switch with reference to a direction of signal flow in said selected channel, and adjusting means arranged in cooperation with the signal generating means to adjust the frequencies of the first and second modulating signals within their respective frequency resolutions so as to change the channel frequency of the output signal.

10. Apparatus as claimed in claim 9, wherein the signal generating means comprises a first synthesizer for producing the first analogue modulating signal, and a second synthesizer for producing the second analogue modulating signal.

11. Apparatus as claimed in claim 9, wherein the first and/or second processing means comprises a mixing unit.

* * * * *